(12) United States Patent
Kuo et al.

(10) Patent No.: US 11,602,090 B2
(45) Date of Patent: Mar. 7, 2023

(54) SHIELDING STRUCTURE AND MANUFACTURING METHOD THEREOF

(71) Applicant: WISTRON NEWEB CORPORATION, Hsinchu (TW)

(72) Inventors: Yu-Fu Kuo, Hsinchu (TW); Jing-Jing Gong, Hsinchu (TW)

(73) Assignee: WISTRON NEWEB CORPORATION, Hsinchu (TW)

(*) Notice: Subject to any disclaimer, the term of this patent is extended or adjusted under 35 U.S.C. 154(b) by 0 days.

(21) Appl. No.: 17/399,253

(22) Filed: Aug. 11, 2021

(65) Prior Publication Data

US 2023/0026176 A1 Jan. 26, 2023

(30) Foreign Application Priority Data

Jul. 22, 2021 (CN) .......................... 202110829640.3

(51) Int. Cl.
*H05K 9/00* (2006.01)
(52) U.S. Cl.
CPC ........... *H05K 9/0049* (2013.01); *H05K 9/003* (2013.01); *H05K 9/0032* (2013.01); *H05K 9/0088* (2013.01)

(58) Field of Classification Search
CPC .................................................. H05K 9/0049
See application file for complete search history.

(56) References Cited

U.S. PATENT DOCUMENTS

| | | | |
|---|---|---|---|
| 11,259,410 B2 | 2/2022 | Yusa et al. | |
| 2018/0013251 A1 | 1/2018 | Seo et al. | |
| 2019/0069400 A1* | 2/2019 | Yusa | H05K 1/183 |
| 2020/0256891 A1* | 8/2020 | Williams | G01R 1/07342 |
| 2021/0105917 A1* | 4/2021 | Garcia Vila | H05K 5/0004 |

FOREIGN PATENT DOCUMENTS

| | | |
|---|---|---|
| CN | 109076692 A | 12/2018 |
| TW | 201640973 A | 11/2016 |

* cited by examiner

*Primary Examiner* — Hung V Ngo
(74) *Attorney, Agent, or Firm* — McClure, Qualey & Rodack, LLP

(57) ABSTRACT

A shielding structure and a manufacturing method thereof are provided. The shielding structure includes a metal housing, a plastic member, and a conductive trace. The metal housing has an inner surface and an internal space. The plastic member is disposed on the inner surface and in the internal space and has an accommodating space. The conductive trace is disposed on the plastic member and in the accommodating space, wherein the plastic member is between the conductive trace and the metal housing.

19 Claims, 9 Drawing Sheets

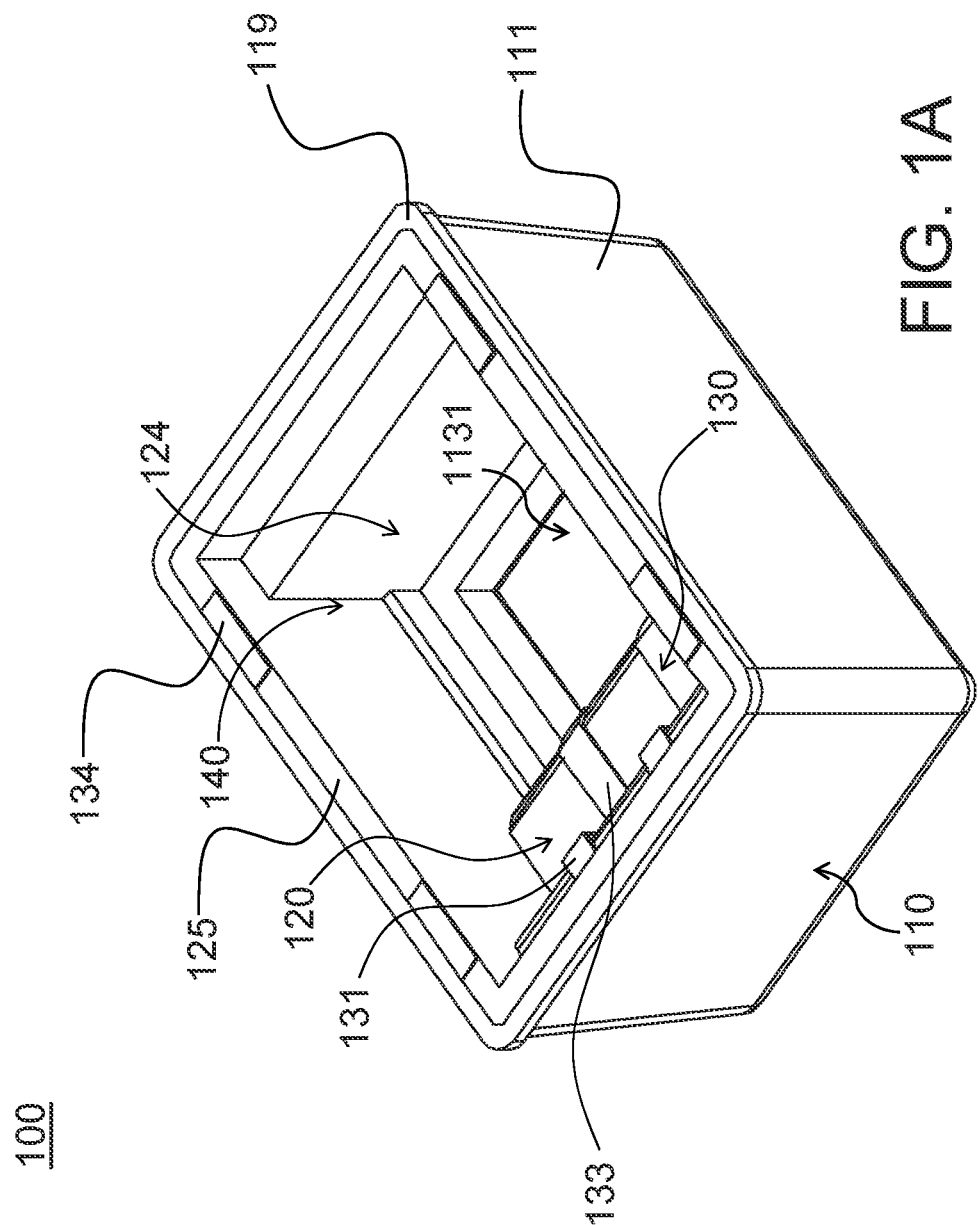

SHIELDING STRUCTURE AND MANUFACTURING METHOD THEREOF

CROSS-REFERENCE TO RELATED PATENT APPLICATION

This application claims the benefit of priority to China Patent Application No. 202110829640.3, filed on Jul. 22, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a shielding structure and a manufacturing method thereof, and more particularly, to a shielding structure with conductive trace and a manufacturing method thereof.

BACKGROUND OF THE DISCLOSURE

Electronic devices rely on many electronic components in their operations, and some of the electronic components require to be protected by shielding cover from electromagnetic interferences. The current shielding cover on the market is usually designed to shield multiple electronic components that are arranged horizontally on a carrier board such as printed circuit board (PCB), but if an electronic components wants to have additional control functionality, a larger space would be required to implement circuits, which in turn would occupy an already limited space on the PCB.

Therefore, it is critical to stack multiple electronic components on the PCB while providing sufficient shielding effect, so as to enhance the utilization rate of the space on the PCB.

SUMMARY OF THE DISCLOSURE

In response to the above-referenced technical inadequacies, the present disclosure provides a shielding structure and a manufacturing method thereof, in which the shielding structure includes a circuit design arranged on the inside so that the control requirement for electronic components stacked under the shielding structure can be met, thereby saving space on the PCB.

An object of the present disclosure is to provide a shielding structure that includes a metal housing, a plastic member, and a conductive trace. The metal housing has an inner surface and an internal space. The plastic member is disposed on the inner surface and in the internal space and has an accommodating space. The conductive trace is disposed on the plastic member and in the accommodating space, in which the plastic member is between the metal housing and the conductive trace.

Another object of the present disclosure is to provide a method of manufacturing a shielding structure that includes the steps of: providing a metal sheet plate; forming the aforementioned metal housing by stamping the metal sheet plate; forming the aforementioned plastic member by injection molding a plastic material into the metal housing, in which a connecting surface of the plastic member is attached to an inner surface of the metal housing; laser patterning an exposed surface of the plastic member; and forming the aforementioned conductive trace by chemical plating the exposed surface of the plastic member.

As aforementioned, the shielding structure and the manufacturing method thereof provided by the present disclosure has the conductive trace disposed inside the metal housing through the plastic member, and so the shielding structure is functionally capable of providing shielding and conductive controlling. Therefore, by utilizing configuration of the conductive trace, multiple electronic components can be stacked on the PCB under the shielding structure, and the utilization rate of the space on PCB is enhanced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1A is a schematic diagram of a shielding structure according to an embodiment of the present disclosure;

DETAILED DESCRIPTION OF THE EXEMPLARY EMBODIMENTS

Figure 1B:
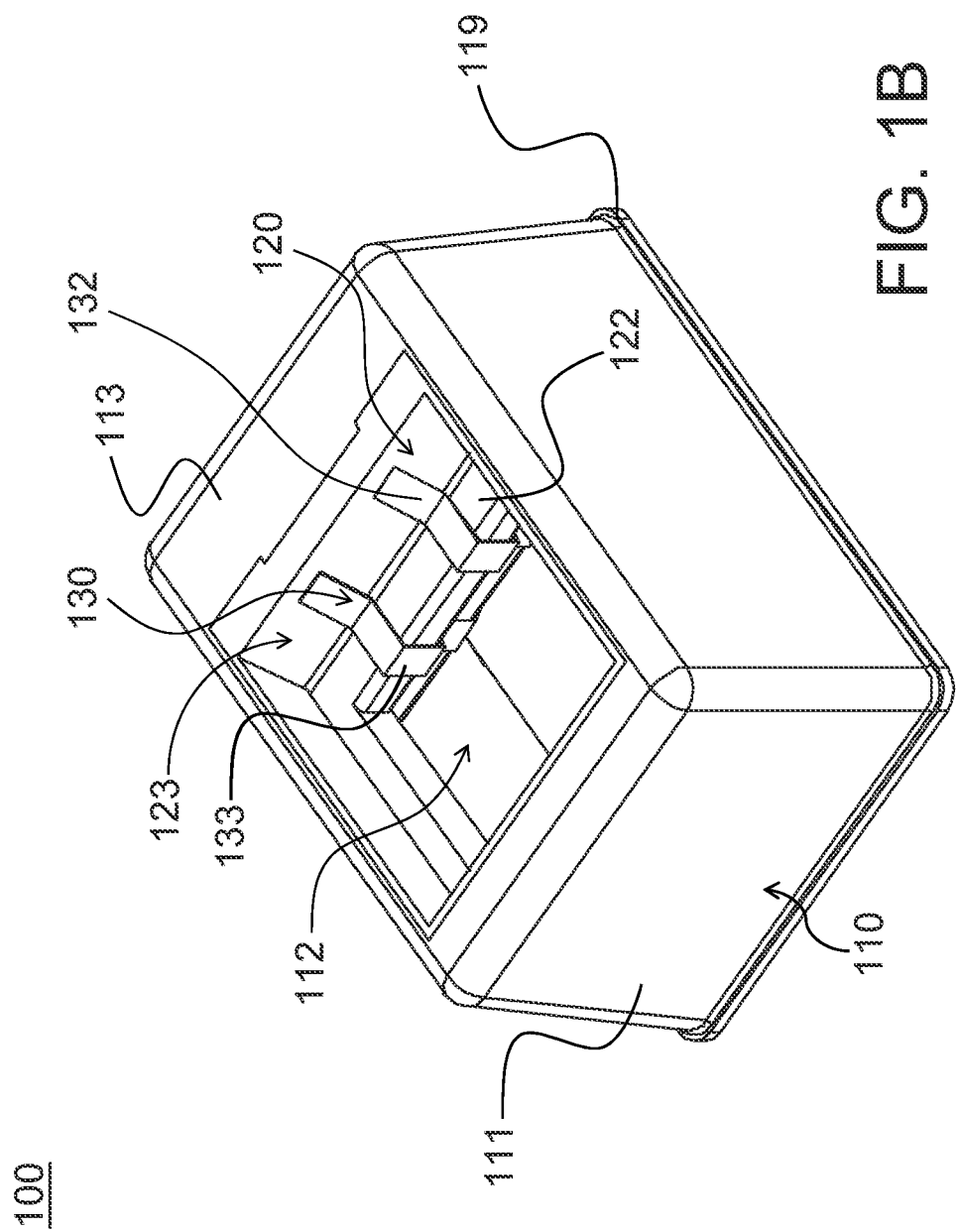
FIG. 1B is a schematic diagram of a shielding structure viewing from another angle according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
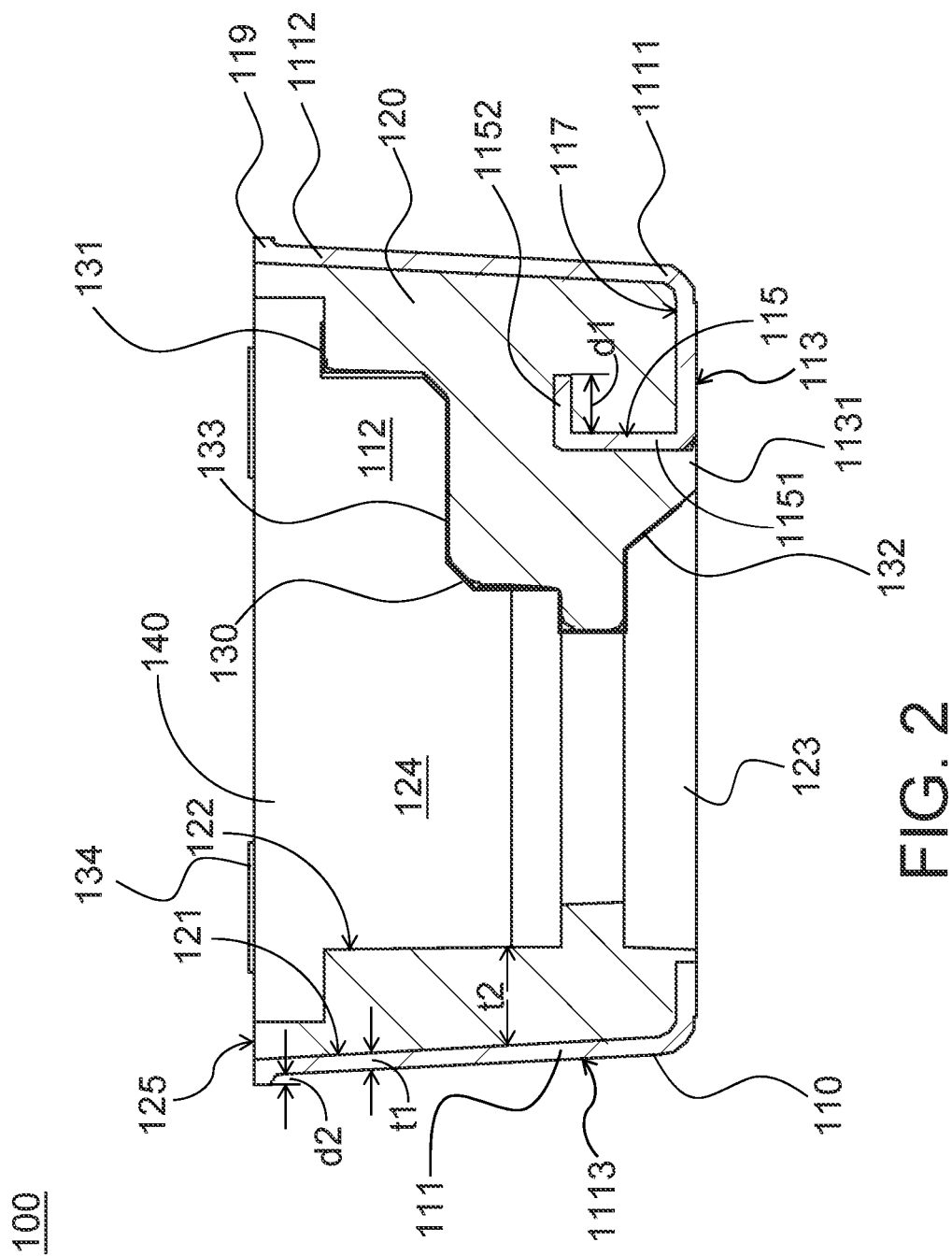
FIG. 2 is a cross-sectional view of a shielding structure according to an embodiment of the present disclosure.

Referring to FIGS. 1A, 1B, and 2, a shielding structure 100 according to an embodiment of the present disclosure mainly includes a metal housing 110, a plastic member 120, and a conductive trace, in which the plastic member 120 is disposed in the metal housing 110, and the conductive trace 130 is disposed on the plastic member 120. The shielding structure 100 is shaped like a cover with an opening 140 for shielding or covering electronic components on a printed circuit board (PCB).

More specifically, the metal housing 110 is shaped like a cover and has a side wall 111 and a top side 113. One end of the side wall 111, namely the first end 1111, connects to the top side 113, and another end of the side wall 111, namely the second end 1112, forms the opening 140. The side wall 111 and the top side 113 form an internal space 112 that is connected to the opening 140. In one embodiment, a metal top opening 1131 is disposed on the top side 113 for the electronic components to perform functional operations, for example but not limited to, laser or radio frequency emission. The metal top opening 1131 and the internal space 112 are connected, and so the opening 140, the internal space 112, and the metal top opening 1121 form a hollow passage.

Figure 4A:
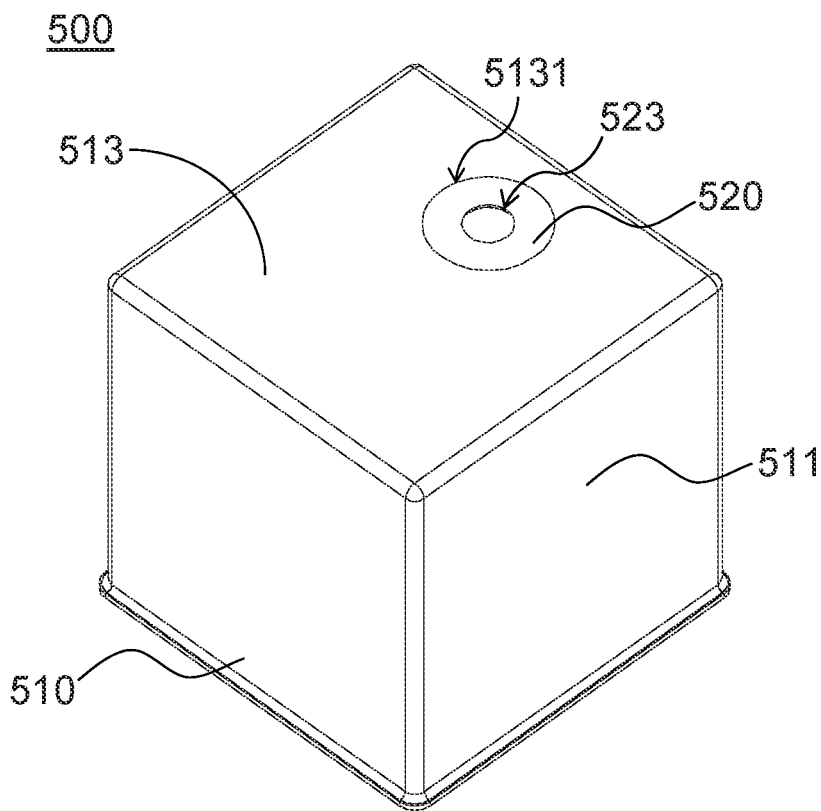
FIG. 4A is a schematic diagram of a shielding structure according to another embodiment of the present disclosure.
Figure 4B:
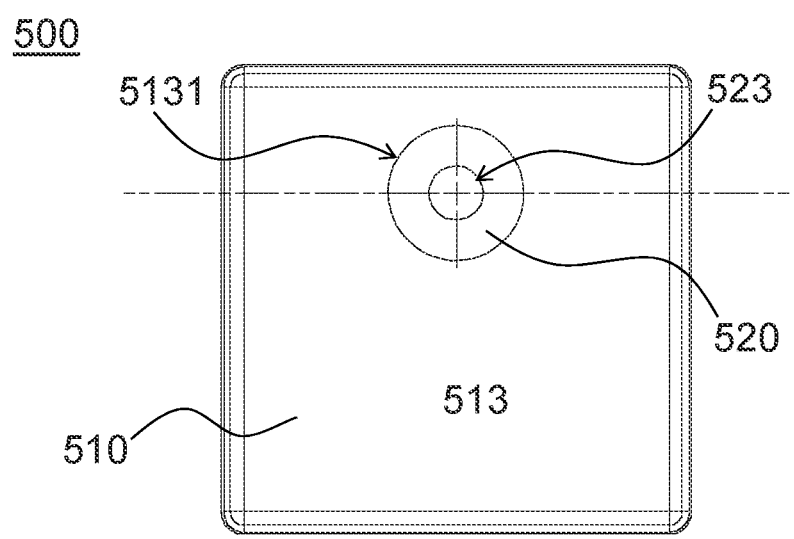
FIG. 4B is a top view of the shielding structure illustrated in FIG. 4A.
Figure 4C:
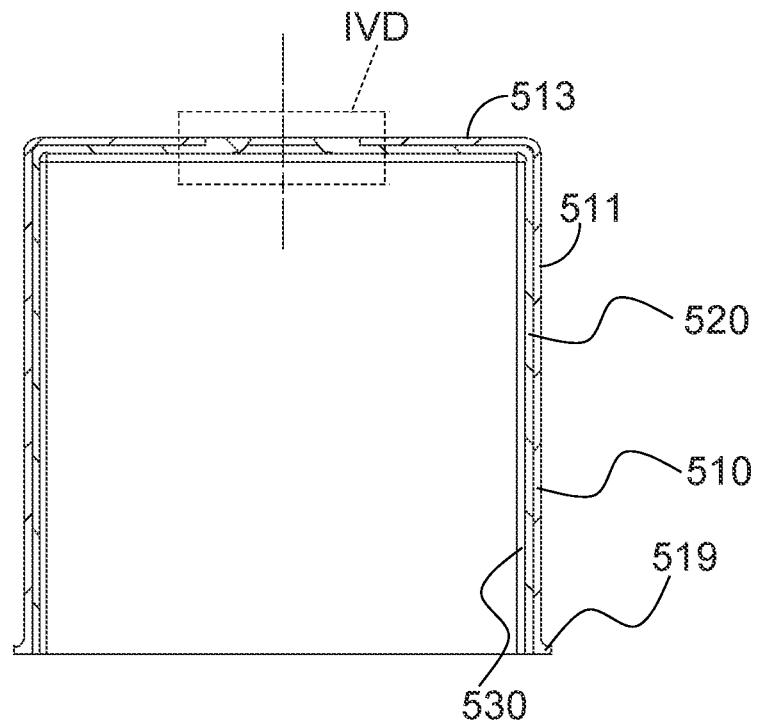
FIG. 4C is a cross-sectional view of the shielding structure illustrated in FIG. 4A.
Figure 4D:
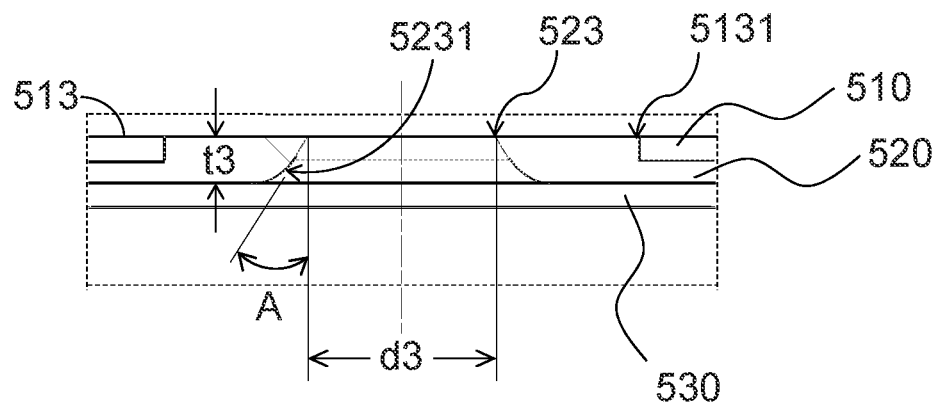
FIG. 4D is a partially enlarged view illustrating IVD of FIG. 4C.

The metal top opening 1131 may be rectangular as shown in FIG. 1A or circular as shown in FIG. 4A, the present disclosure is not limited thereby. Preferably, the metal top opening 1131 has a size equal to or larger than 0.5 mm in width or diameter. In other embodiments, the metal housing 110 may have one or a plurality of metal top openings 1131, the present disclosure does not limit the number of metal top openings 1131.

The metal housing includes a fixed structure 115 for strengthening the bonding between the metal housing 110 and the plastic member 120. The fixed structure 115 is a bending structure extending into the internal space 112 of the metal housing 110, and preferably, the fixed structure 115 is approximately perpendicular to an inner surface 117 of the metal housing 110. As shown in FIG. 2, when there is a metal top opening 1131 on the top side 113, the fixed structure 115 bends inwardly from the edge of the metal top opening 1131 toward the inside of the metal housing 110. In specific, the fixed structure 115 bends perpendicularly from the edge of the metal top opening 1131 toward the opening 140.

Moreover, the fixed structure 115 includes a first bending portion 1151 and a second bending portion 1152, in which one end of the first bending portion 1151 connects to the metal top opening 1131 on the top side 113, and another end of the first bending portion 1151 connects to the second bending portion 1152. The first bending portion 1151 is connected to the metal top opening 1131 in a configuration that is perpendicular to the top side 113 and pointing toward the internal space 112. The second bending portion 1152 is connected to the first bending portion 1151 in a configuration that is perpendicular to the side wall 111 and the first bending portion 1151. Therefore, the first bending portion 1151 and the second bending portion 1152 compose a structure with an L-shape, and the first being portion 1151, the second bending portion 1152, and the top side 113 form a hook-like structure. In other words, the first bending portion 1151 and the second bending portion 1152 are disposed in the internal space 112 of the metal housing 110, in which the first bending portion 1151 is perpendicular to the inner surface 117 of the metal housing 110 adjacent to the top side 113, and the second bending portion 1152 is perpendicular to the inner surface 117 of the metal housing 110 adjacent to the side wall 111.

In other embodiments, the fixed structure 115 may be disposed at the opening 140 of the shielding structure 100. For example, the fixed structure 115 can extend from the second end 1112 of the side wall 111 toward the internal space 112 of the metal housing 110. More specifically, the fixed structure 115 bends horizontally from the second end 1112 of the side wall 111 toward the side wall 111 opposite thereto, such as the fixed structure 115 extending from the second end 1112 toward the center of the opening 140 and then bending inwardly toward an internal direction of the metal housing 110, namely toward the top side 113. As such, the first bending portion 1151 is connected to the second end 1112 of the side wall 111 in a configuration that is parallel to the top side 113 and pointing toward the center of the opening 140, and the second bending portion 1152 is connected to the first bending portion 1151 in a configuration that is perpendicular to the top side 113 and the first bending portion 1151.

In short, the fixed structure 115 is placed inside the internal space 112 of the metal housing 110 and perpendicular to the inner surface 117 of the metal housing 110 and has at least one bending portion 1151, 1152. A bending length d1 of each bending portion 1151, 1152 is 0.5 mm to 1 mm. It is to be noted that the structural details of the aforementioned fixed structure 115 is only for exemplary purpose and does not limit the structural configuration of the fixed structure 115 of the present disclosure.

The metal housing 110 further includes a skirt structure 119 disposed at the second end 1112 of the side wall 111 for controlling the size of the shielding structure 100. The skirt structure 119 extends from the second end 1112 of the side wall 111 toward the outside of the metal housing 110 and is approximately perpendicular to an outer surface 1113 of the side wall 111 or is approximately parallel to the top side 113. In another words, the skirt structure 119 is a flange that extends outward from the second end 1112 of the side wall 111, and preferably, the skirt structure 119 has a skirt width d2 of 0.05 mm to 0.15 mm.

In one embodiment, the thickness t1 of the metal housing 110 is 0.1 mm to 0.4 mm, but the present disclosure does not limit the thickness of the metal housing 110.

In one embodiment, the metal housing 110 is made of stainless steel or copper, like copper-nickel alloy or brass, but the present disclosure does not limit the material of the metal housing 110.

The plastic member 120 is disposed in the internal space 112 of the metal housing 110 and on the inner surface 117 of the metal housing 110, in which the structural design and parameter of the plastic member 120 may be adjusted according to needs, so that the conductive trace 130 disposed on the plastic member 120 is in contact with the electronic components. The plastic member 120 has a connecting surface 121 and an exposed surface 122, in which the connecting surface 121 and the exposed surface 122 are opposite faces on the plastic member 120, and the connecting surface 121 is attached to the inner surface 117 of the metal housing 110. Referring to FIG. 2, the plastic member 120 covers almost all of the inner surface 117 of the metal housing 110 and envelopes the fixed structure 115 entirely within, in which the enveloped first bending portion 1151 and second bending portion 1152 form a bond with the plastic member 120, thereby enforcing the attachment and bonding between the plastic member 120 and the metal housing 110.

The exposed surface 122 of the plastic member 120 forms an accommodating space 124 that is partially overlapping with the internal space 112 of the metal housing 110, and the accommodating space 124 connects to the opening 140. In one embodiment, the accommodating space 124 of the plastic member 120 has a stairs-like shape, namely the exposed surface 122 has a stairs-like structure, but the present disclosure is not limited thereby. The shape of the accommodating space 124 may be adjusted due to the size, the appearance, the stacking configuration, the circuit design, of the electronic component; the accommodating space 124 does not have to be in a certain shape.

In one embodiment, the plastic member 120 has a plastic top opening 123 corresponding to the metal top opening 1131, in which the plastic top opening 123 may be rectangular or circular and has a size that is preferably equal to or larger than 0.15 mm in width or diameter but smaller than that of the metal top opening 1131. The plastic top opening 123 is connected to the accommodating space 124, and therefore the opening 140, the accommodating space 124, and the plastic top opening 123 form a hollow passage.

In one embodiment, the thickness t2 of the plastic member 120 is 0.15 mm to 1 mm, which is adjustable according to the space design of the shielding structure 100, in which the thickness t2 is the distance from the connecting surface 121 to the exposed surface 122. It is to be noted that the present disclosure does limit the thickness of the plastic member 120 thereby.

In one embodiment, the plastic member 120 is formed inside of and attached to the metal housing 110 by injection molding, but the present disclosure does not limit how the plastic member 120 is formed and attached to the metal housing 110.

In one embodiment, the plastic member 120 is made of laser-direct-structuring (LDS) plastic material, like polyamide or liquid crystal polymer with high fluidity, but the present disclosure does not limit the material of the plastic member 120.

The conductive trace 130 is disposed in the accommodating space 124 of the plastic member 120 for contacting the electronic component and serving as the circuit link between the electronic component and an external control component. The conductive trace 130 is disposed on the exposed surface 122 of the plastic member 120 and extends from near the top side 113 of the metal housing 110 to near the second end 1112 of the side wall 111. In other words, the conductive trace 130 extends from the plastic top opening 123 of the plastic member 120 to the exposed surface 122 near the opening 140.

In one embodiment, the conductive trace 130 includes at least one first contact portion 131, at least one second contact portion 132, and at least one connect portion 133. The first contact portion 131 is disposed on the exposed surface 122 of the plastic member 120 at where the opening 140 is close by, and the first contact portion 131 is preferably arranged to face toward the opening 140 for attaching and contacting an electronic component or a PCB. The second contact portion 132 is disposed on the exposed surface 122 of the plastic member 120 at where the plastic top opening 123 is close by, and the second contact portion 132 is preferably arranged to face toward the plastic top opening 123 for contacting an electronic component or other components. The connect portion 133 is disposed on the exposed surface 122 between the first contact portion 131 and the second contact portion 132 for connecting the first contact portion 131 and the second contact portion 132 or contacting a conductive film such as indium-tin oxide, an electronic component, or other components.

In one embodiment, the conductive trace 130 is in a form of a strip, in which the first contact portion 131 and the second contact portion 132 are positioned respectively at the two ends of the conductive trace 130, and the connect portion 133 is positioned between the two ends of the conductive trace 130.

In one embodiment, the conductive trace 130 is in a form of two strips, in which each of the two strips has a first contact portion 131 and a second contact portion 132 disposed respectively at its two ends, as well as a connect portion 133 disposed between its two ends.

In one embodiment, the conductive trace 130 further includes at least one conductive portion 134 disposed on the underside 125 of the plastic member 120 where the opening 140 is, for connecting to the PCB.

Figure 3:
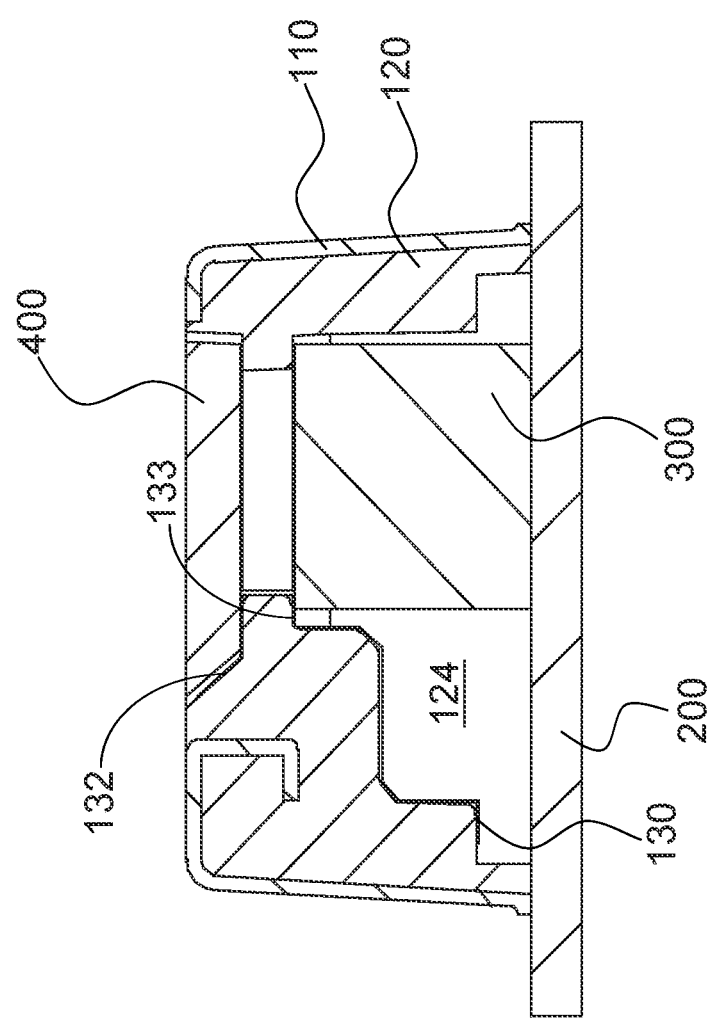
FIG. 3 illustrates a practical application of a shielding structure according to an embodiment of the present disclosure.

Referring to FIG. 3, the structural design of the shielding structure 100 according to the present disclosure allows a first electronic component 300 and a second electronic component 400 to be arranged vertically on a PCB 200 and at the same time, provides the shielding effect as needed by the first electronic component 300 and the second electronic component 400. In detail, the shielding structure 100 is attached to the printed circuit board 200 via the opening 140 and so the first electronic component 300 and the second electronic component 400 are placed in the accommodating space 124 through the opening 140. The plastic member 120 is structurally designed to place the second electronic component 400 near the plastic top opening 123 and in contact with the second contact portion 132 of the conductive trace 130, and the first electronic component 300 is also put in contact with the connect portion 133 of the conductive trace 130. Hence, through the plastic member 120 and the conductive trace 130 of the shielding structure 100, the second electronic component 400 may be stacked on top of the first electronic component 300 and connected to other electronic components, such as but not limited to, the first electronic component or an external control component. As a result, a save on the use of space on the PCB 200 is achieved, and so the utilization rate of the space is enhanced.

Referring to FIGS. 4A to 4D, a shielding structure 500 according to another embodiment of the present disclosure includes a metal housing 510, a plastic member 520, and a conductive trace 530, in which the plastic member 520 is disposed between the metal housing 510 and the conductive trace 530, and the conductive trace 530 extends to the outside through the plastic member 520. Particularly, a metal top opening 5131 is disposed on a top side 513 of the metal housing 510, and the plastic member 520 has a plastic top opening 523 corresponding to the metal top opening 5131, in which the conductive trace 530 extends to the outside through the plastic top opening 523 of the plastic member 520. In general, the plastic top opening 523 of the plastic member 520 would be smaller than the metal top opening 5131 of the metal housing 510. If a draft angle A at an opening side wall 5231 of the plastic member 520 is less than 30 degrees, the diameter d3 of the plastic top opening 523 is equal to or greater than two times the thickness t3 of the plastic member 520 at the top.

In one embodiment, a skirt structure 519 is disposed at the end of the side wall 511 of the metal housing 510 that is away from the top side 513 and extends outward from the side wall 511 in a configuration that is approximately perpendicular to the side wall 511.

Figure 5A:
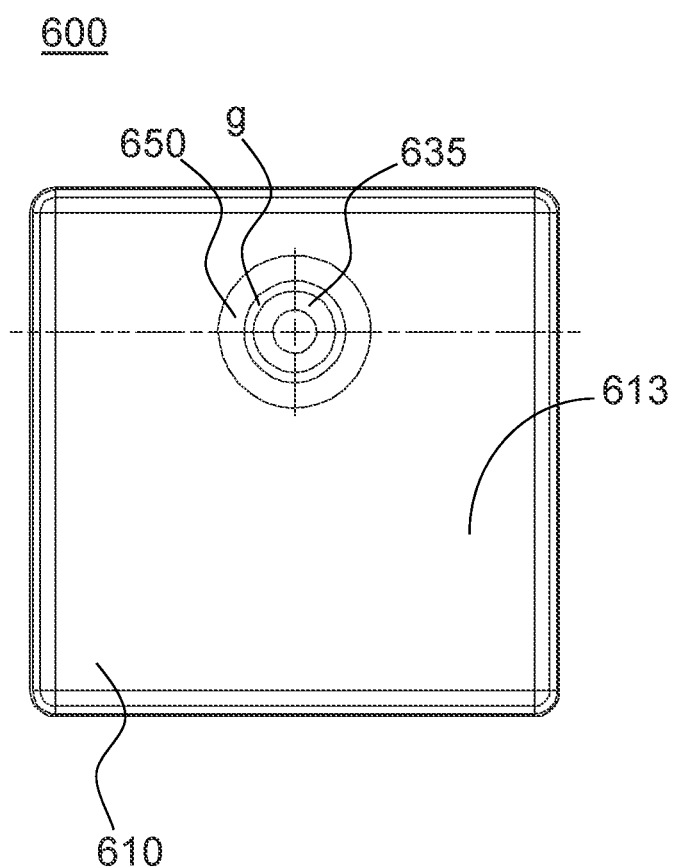
FIG. 5A is a top view of a shielding structure according to yet another embodiment of the present disclosure.
Figure 5B:
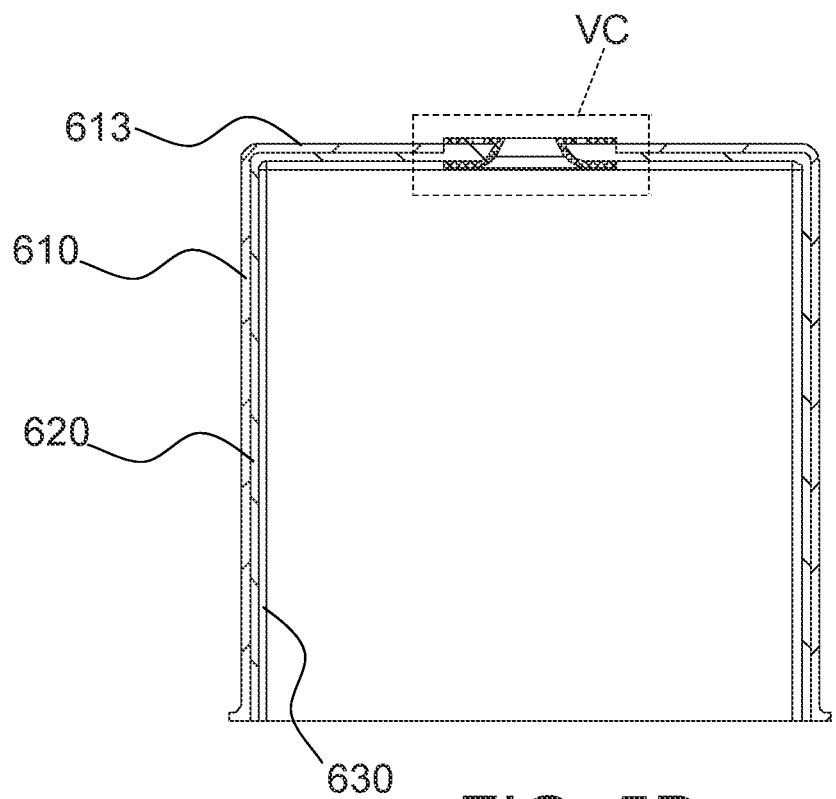
FIG. 5B is a cress-sectional view of the shielding structure illustrated in FIG. 5A.
Figure 5C:
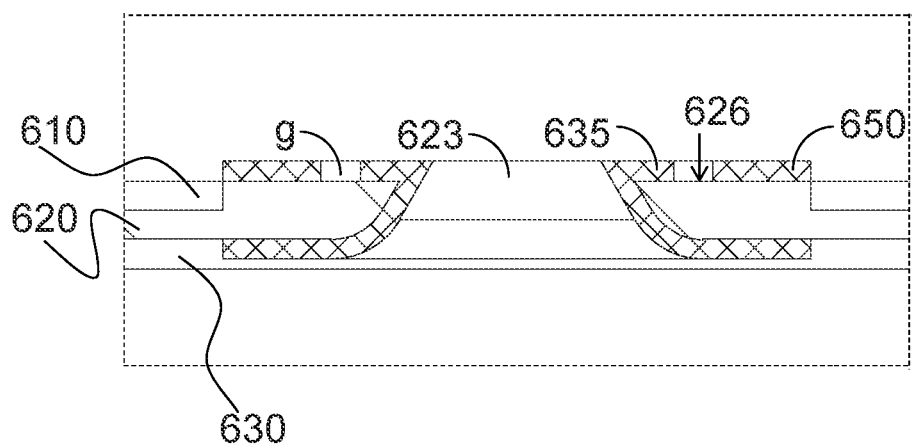
FIG. 5C is a partially enlarged view illustrating VC of FIG. 5B.

Referring to FIGS. 5A to 5C for a shielding structure 600 according to yet another embodiment of the present disclosure. Similar to the shielding structure 500, the shielding structure 600 includes a metal housing 610, a plastic member 620, and a conductive trace 630, in which the plastic member 620 is disposed between the metal housing 610 and the conductive trace 630, and the conductive trace 630 extends to the outside through the plastic member 620. The shielding structure 600 differs from the shielding structure 500 in that the conductive trace 630 of the shielding structure 600 further includes an external portion 635 disposed on the upper side 626 of the plastic member 620. The conductive trace 630 extends along the plastic top opening 623 of the plastic member 620 to the outside and covers part of the upper side 626 of the plastic member 620 to form the external portion 635. The external portion 635 serves as a contact point for connecting to a conductive film or other components.

Furthermore, the shielding structure 600 includes a metal portion 650 disposed on the upper side 626 of the plastic member 620 for re-enforcing the shielding effect of the shielding structure 600 affected by the openings. The metal portion 650 is adjacent to the top side 613 of the metal housing 610, and there is a gap g between the metal portion 650 and the external portion 635 of the conductive trace 630, in which the gap g is equal to or greater than 0.2 mm. The metal portion 650 is made of metal material, and the present disclosure does not limit the material of the metal portion 650.

Figure 6:
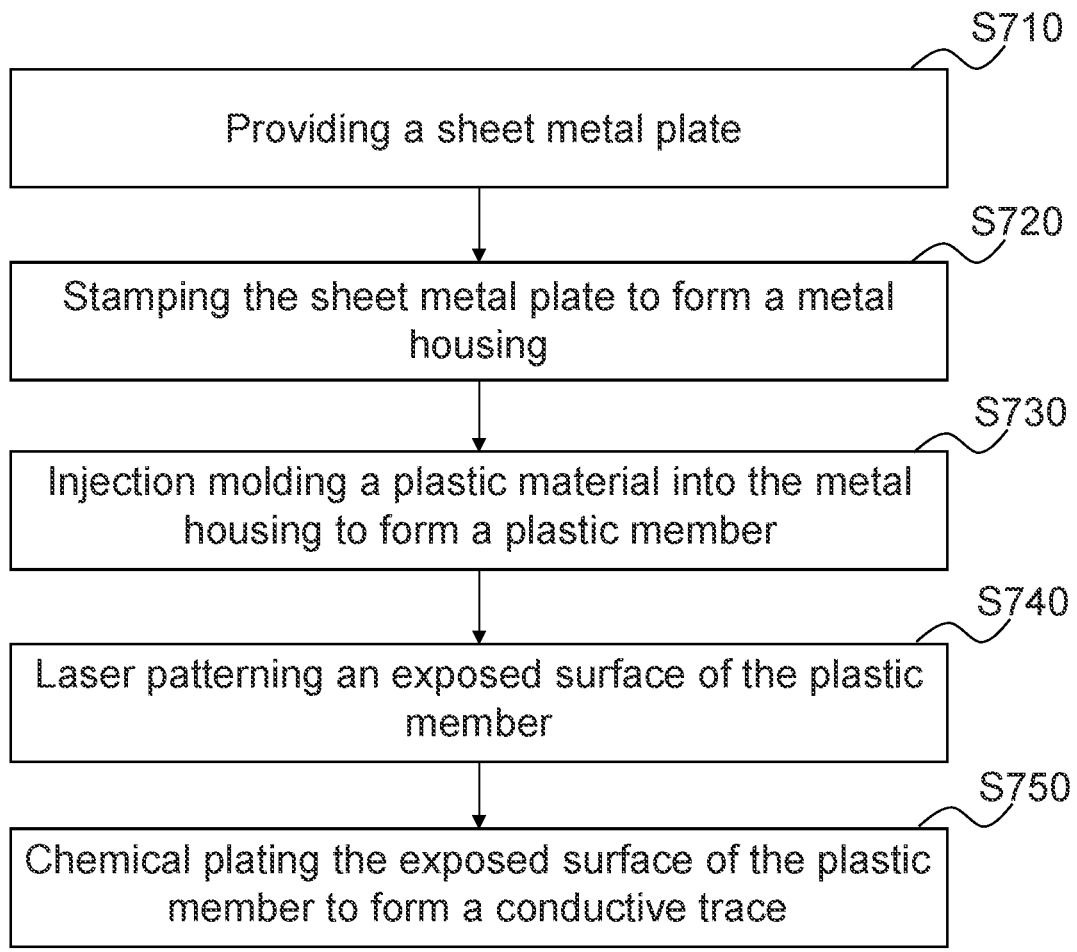
FIG. 6 is a flow chart of a method of manufacturing a shielding structure according to an embodiment of the present disclosure.

Referring to FIG. 6 for a flowchart of a method of manufacturing a shielding structure according to the present disclosure. First in step S710, a sheet metal plate is provided, and then the sheet metal plate is stamped to form a metal housing in step S720. The metal housing is shaped like a cover and has a side wall and a top side, in which the top side has a metal top opening and a fixed structure, and one end of the side wall has a skirt structure. The number of metal top opening may be singular or plural, and the shape of the metal top housing may be rectangular or circular; the present disclosure does not limit the number and the shape of the metal top opening.

S730 is to form a plastic member inside the metal housing by injection molding with plastic material. The plastic member covers the inner surface of the metal housing and envelopes the fixed structure therein, so as to enforce the bonding between the plastic member and the metal housing, in which a connecting surface of the plastic member is attached to the inner surface of the metal housing. The plastic member has a plastic top opening corresponding to the metal top opening.

Next, an exposed surface of the plastic member undergoes a laser patterning process in step 740, and step 750 is to form a conductive trace on the exposed surface of the plastic member by chemical plating.

In one embodiment, step 740 includes performing the laser patterning process on the exposed surface of the plastic member where the conductive trace, including an external portion of the conductive trace, is to be formed, for example but not limited to, the upper side of the plastic member, and where a metal portion is to be formed, for example but not limited to, the upper side of the plastic member, and step 750 includes performing the chemical plating process so that the conductive trace, including the external portion, and the metal portion are formed at respective places on the exposed surface of the plastic member, for example but not limited to, the upper side of the plastic member.

In one embodiment, the manufacturing method preferably uses LDS process to form the plastic member in the metal housing that is made by sheet metal stamping and to form the conductive trace on the plastic member.

In one embodiment, the material of the sheet metal plate is stainless steel, copper, copper-nickel alloy, or brass. The plastic material is a high flow polyamide or high flow liquid crystal polymer, which is not only resistant to high temperature but its fine fluidity makes the formation inside the metal housing easier. The metal housing has a thickness of 0.1 mm to 0.4 mm, and the plastic member has a thickness ranging from 0.15 mm to 1 mm. The size of the metal top opening is equal to or larger than 0.5 mm in diameter or width, and the plastic top opening has a size of larger than 0.15 mm in diameter or width but smaller than the metal top opening. If a draft angle of the plastic top opening side wall is greater than 30 degrees, just one LDS process is required; if the draft angle is less than 30 degrees, the size of the plastic top opening needs to be equal to or greater than two times the top thickness of the plastic member, for the process to continue. In one embodiment, the plastic material is composed of a high flow polyamide or a high flow liquid crystal polymer and fiber glass, in which the fiber glass is about 15% to 50% of the total composition of the plastic material.

The method of manufacture a shielding structure according to the present disclosure is mainly to form an internal plastic layer in the sheet metal by injection molding and then form a circuit in the shielding structure by laser patterning the surface of the plastic layer with LDS process before chemical plating the patterned surface.

Through the shielding structure and manufacturing method provided by the present disclosure, conductive trace can be disposed inside the shielding structure so that there are circuits in the shielding structure for the stacked electronic components, thereby meeting the control requirements for the electronic components. In addition, the shielding structure may have openings at the top for laser or radio frequency emission as desired, and the internal circuit design is flexible and adaptive through changing the plastic member structure. Thus, the use of space on the PCB is reduced and the space utilization rate is increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A shielding structure comprising:
   a metal housing, comprising an inner surface and an internal space;
   a plastic member, disposed on the inner surface and in the internal space of the metal housing and comprising an accommodating space; and
   a conductive trace, disposed on the plastic member and in the accommodating space;
   wherein the plastic member is between the metal housing and the conductive trace; and
   wherein the metal housing further comprises a fixed structure disposed in the internal space, the fixed structure is perpendicular to the inner surface and comprises at least one bending portion, and the plastic member envelopes the fixed structure.

2. The shielding structure according to claim 1, wherein the metal housing comprises a top side, a side wall, and an opening, the top side and the side wall form the internal space, one end of the side wall connects to the top side, and another end of the side wall forms the opening.

3. The shielding structure according to claim 2, further comprising:
   a metal top opening, disposed on the top side; and
   a plastic top opening, corresponding to the metal top opening and disposed on the plastic member;
   wherein, when a draft angle at an opening side wall of the plastic member is less than 30 degrees, a diameter of the plastic top opening is equal to or greater than two times a top thickness of the plastic member.

4. The shielding structure according to claim 3, wherein the fixed structure is connected to the metal top opening or to the another end of the side wall that forms the opening.

5. The shielding structure according to claim 3, wherein the metal housing further comprises a skirt structure perpendicular to the side wall and extending outward from the another end of the side wall that forms the opening.

6. The shielding structure according to claim 3, wherein the conductive trace comprises:
   a first contact portion, disposed on the plastic member near the opening, for contacting an electronic component or a printed circuit board;
   a second contact portion, disposed on the plastic member near the top side, for contacting another electronic component; and
   a connect portion, disposed between the first contact portion and the second contact portion, for connecting the first contact portion and the second contact portion.

7. The shielding structure according to claim 6, wherein the conductive trace further comprises a conductive portion, disposed on an underside of the plastic member, for connecting to the printed circuit board.

8. The shielding structure according to claim 6, further comprising a metal portion disposed on an upper side of the plastic member, wherein the conductive trace further comprises an external portion disposed on the upper side of the plastic member for contacting an external component, and a gap between the metal portion and the external portion is equal to or greater than 2 mm.

9. The shielding structure according to claim 1, wherein the plastic member comprises a connecting surface and an exposed surface, the connecting surface is attached to the inner surface, and the conductive trace is disposed on the exposed surface.

10. A method of manufacturing a shielding structure, comprising:
    providing a sheet metal plate;
    stamping the sheet metal plate to form the metal housing of claim 1;
    injection molding a plastic material into the metal housing to form the plastic member of claim 1, wherein the plastic member comprises a connecting surface and an exposed surface, and the connecting surface is attached to an inner surface of the metal housing;
    laser patterning the exposed surface of the plastic member; and
    chemical plating the exposed surface of the plastic member to from the conductive trace of claim 1.

11. The method of manufacturing the shielding structure according to claim 10, further comprising:
    laser patterning an upper side of the plastic member; and
    chemical plating the upper side of the plastic member to form a metal portion and an external portion.

12. The method of manufacturing the shielding structure according to claim 11, wherein the sheet metal plate is made of stainless steel, copper, copper-nickel alloy, or brass, the plastic material is composed of a high flow polyamide or a high flow liquid crystal polymer and fiber glass, wherein the content of the fiber glass is 15% to 50% of a total composition of the plastic material, a thickness of the metal housing is 0.1 mm to 0.4 mm, and a thickness of the plastic member is 0.15 mm to 1 mm.

13. The method of manufacturing the shielding structure according to claim 10, wherein the sheet metal plate is made of stainless steel, copper, copper-nickel alloy, or brass, the plastic material is composed of a high flow polyamide or a high flow liquid crystal polymer and fiber glass, wherein the fiber glass is present at about 15% to 50% of a total composition of the plastic material, a thickness of the metal housing is 0.1 mm to 0.4 mm, and a thickness of the plastic member is 0.15 mm to 1 mm.

14. A shielding structure comprising:
    a metal housing, comprising an inner surface and an internal space;
    a plastic member, disposed on the inner surface and in the internal space of the metal housing and comprising an accommodating space;
    a conductive trace, disposed on the plastic member and in the accommodating space, wherein the plastic member is between the metal housing and the conductive trace, the metal housing comprises a top side, a side wall, and an opening, the top side and the side wall form the internal space, one end of the side wall connects to the top side, and another end of the side wall forms the opening;
    a metal top opening, disposed on the top side; and
    a plastic top opening, corresponding to the metal top opening and disposed on the plastic member;
    wherein, when a draft angle at an opening side wall of the plastic member is less than 30 degrees, a diameter of the plastic top opening is equal to or greater than two times a top thickness of the plastic member.

15. The shielding structure according to claim 14, wherein the fixed structure is connected to the metal top opening or to the another end of the side wall that forms the opening.

16. The shielding structure according to claim 14, wherein the metal housing further comprises a skirt structure perpendicular to the side wall and extending outward from the another end of the side wall that forms the opening.

17. The shielding structure according to claim 14, wherein the conductive trace comprises:
- a first contact portion, disposed on the plastic member near the opening, for contacting an electronic component or a printed circuit board;
- a second contact portion, disposed on the plastic member near the top side, for contacting another electronic component; and
- a connect portion, disposed between the first contact portion and the second contact portion, for connecting the first contact portion and the second contact portion.

18. The shielding structure according to claim 17, wherein the conductive trace further comprises a conductive portion, disposed on an underside of the plastic member, for connecting to the printed circuit board.

19. The shielding structure according to claim 17, further comprising a metal portion disposed on an upper side of the plastic member, wherein the conductive trace further comprises an external portion disposed on the upper side of the plastic member for contacting an external component, and a gap between the metal portion and the external portion is equal to or greater than 2 mm.

* * * * *